United States Patent
Jung

(10) Patent No.: US 9,564,223 B2
(45) Date of Patent: Feb. 7, 2017

(54) SEMICONDUCTOR DEVICE

(71) Applicant: SK hynix Inc., Icheon-si Gyeonggi-do (KR)

(72) Inventor: Sung Wook Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/818,878

(22) Filed: Aug. 5, 2015

(65) Prior Publication Data

US 2016/0260485 A1    Sep. 8, 2016

(30) Foreign Application Priority Data

Mar. 4, 2015   (KR) ................. 10-2015-0030433

(51) Int. Cl.
| | |
|---|---|
| *G11C 16/04* | (2006.01) |
| *G11C 16/10* | (2006.01) |
| *G11C 16/34* | (2006.01) |
| *G11C 7/14* | (2006.01) |

(52) U.S. Cl.
CPC ........... *G11C 16/10* (2013.01); *G11C 16/0483* (2013.01); *G11C 16/3427* (2013.01); *G11C 7/14* (2013.01)

(58) Field of Classification Search
CPC ... G11C 16/0483; G11C 16/28; G11C 17/123; G11C 16/26
USPC .......................................... 365/185.17, 185.2
See application file for complete search history.

(56) References Cited

U.S. PATENT DOCUMENTS

| | | | | |
|---|---|---|---|---|
| 2014/0198575 A1* | 7/2014 | Dutta | ................. | G11C 16/3418 |
| | | | | 365/185.17 |
| 2015/0179266 A1* | 6/2015 | Park | ..................... | G11C 16/10 |
| | | | | 365/185.2 |
| 2015/0294724 A1* | 10/2015 | Nam | ..................... | G11C 16/10 |
| | | | | 365/185.11 |

FOREIGN PATENT DOCUMENTS

| | | |
|---|---|---|
| KR | 100691384 B1 | 2/2007 |
| KR | 1020100053215 A | 5/2010 |
| KR | 1020130137470 A | 12/2013 |

* cited by examiner

*Primary Examiner* — Huan Hoang
(74) *Attorney, Agent, or Firm* — William Park & Associates Ltd.

(57) ABSTRACT

Disclosed is a semiconductor device, including: a memory block including a plurality of memory strings, each of the memory strings including a drain select transistor coupled to a bit line, a source select transistor coupled to a common source line, memory cells coupled to the drain select transistor and the source select transistor, and dummy memory cells coupled to the drain select transistor and the memory cell; and an operation circuit configured to perform a program operation on the memory cells. The operation circuit generates operation voltages applied to the dummy memory cells so that electric charges are generated by a band to band tunneling effect in the dummy memory cell adjacent to the drain select transistor during the program operation.

20 Claims, 8 Drawing Sheets

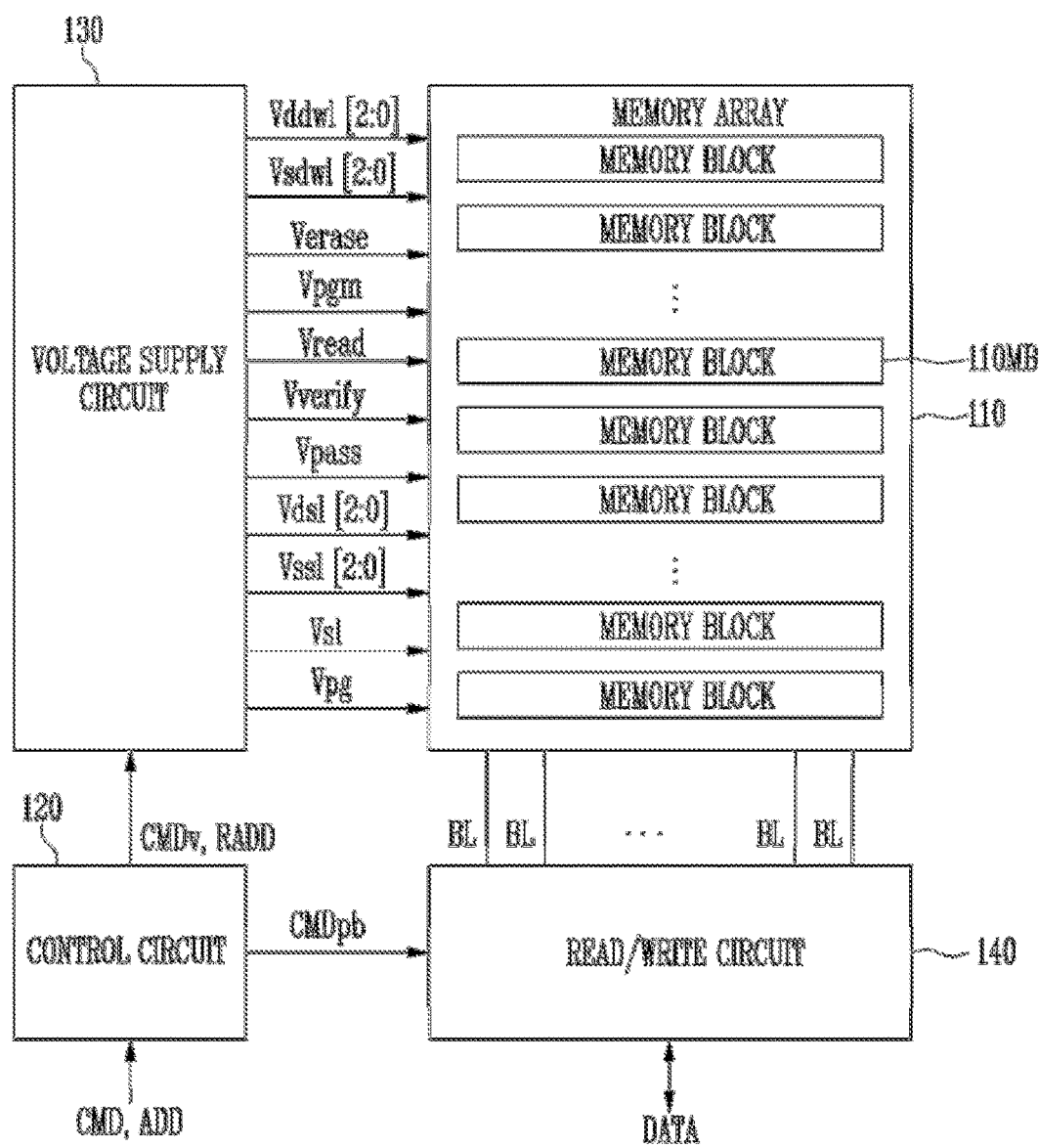

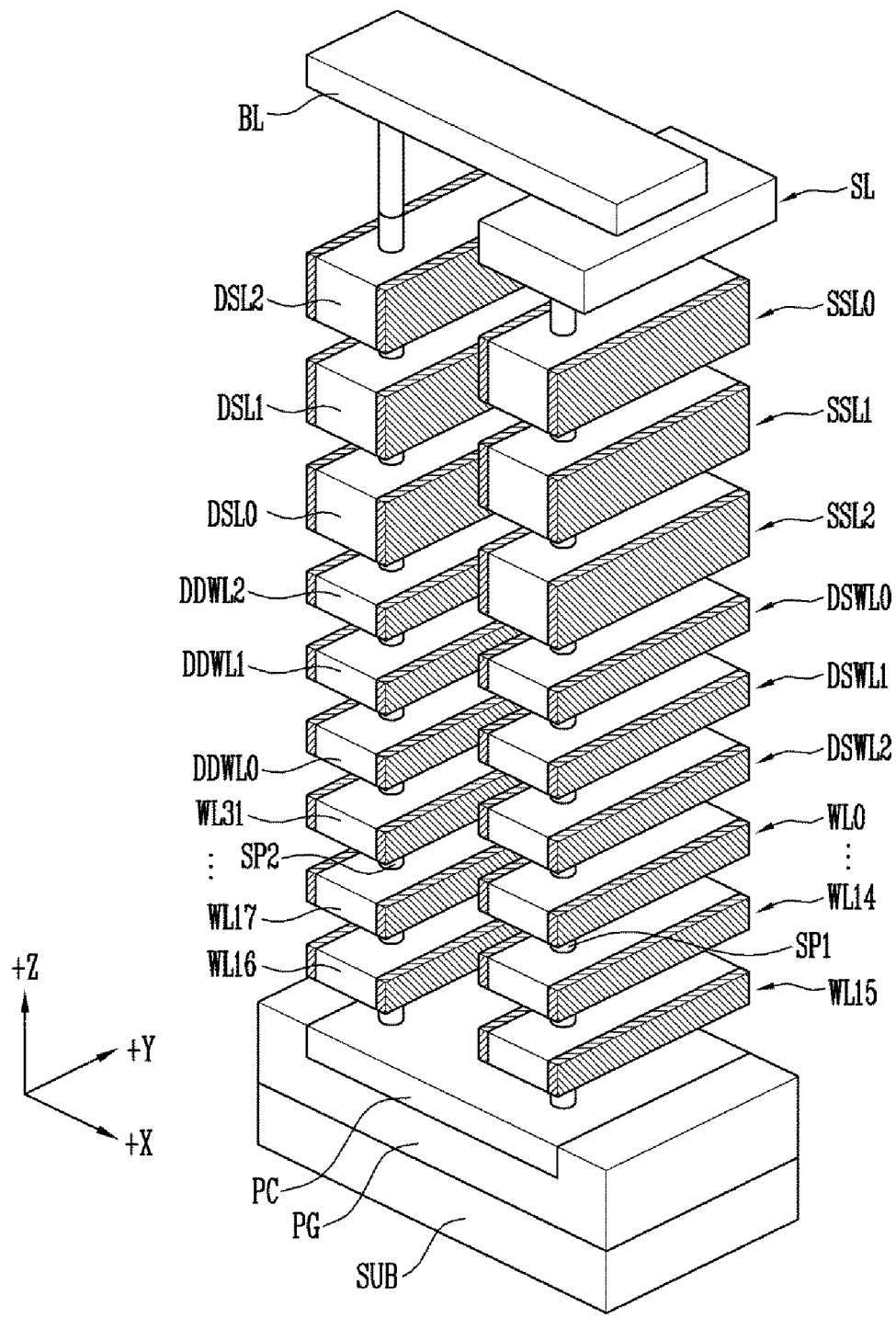

SEMICONDUCTOR DEVICE

CROSS-REFERENCE TO RELATED APPLICATION

The application claims priority to Korean patent application number 10-2015-0030433 filed on Mar. 4, 2015 in the Korean Intellectual Property Office, the entire disclosure of which is incorporated by reference herein.

BACKGROUND

1. Field

Embodiments of the invention generally relate to a semiconductor device, and more particularly to a semiconductor device including memory cells.

2. Discussion of Related Art

In cases where a program operation is performed on a particular type of memory array such as string-type memory arrays, while a program voltage is being applied to a selected word line, a pass voltage is applied to the remaining word lines. Further, the memory cells connected to the selected word line may be divided into selected memory cells (e.g., program permission cells) and unselected memory cells (e.g., program inhibition cells) depending on what data value is going to be stored. In order not to program on unselected memory cells, electrons must be prevented from being injected into unselected memory cells because electron injections may cause threshold voltage level changes. However, unintended electric charge injection may cause variations in threshold voltages of the unselected memory cell, and thus reliability of semiconductor devices may deteriorate.

SUMMARY

The invention has been made in an effort to provide a semiconductor device capable of improving an operation characteristic and improving reliability.

An example embodiment of the invention provides a semiconductor device, including: a memory block including a plurality of memory strings, each of the memory strings including a drain select transistor connected with a bit line, a source select transistor connected with a common source line, memory cells connected between the drain select transistor and the source select transistor, and dummy memory cells connected between the drain select transistor and the memory cell; and an operation circuit configured to perform a program operation of the memory cells, in which wherein the operation circuit generates operation voltages applied to the dummy memory cells, so that electrons are generated by a band to band tunneling effect in the dummy memory cell adjacent to the drain select transistor during the program operation.

An example embodiment of the invention provides a semiconductor device, including: a memory block including memory strings connected between a bit line and a common source line, each of the memory strings including a drain select transistor, dummy memory cells, and memory cells, which are vertically formed on a substrate and are serially connected to the bit line; and an operation circuit configured to perform a program operation of the memory cells, in which the operation circuit generates operation voltages applied to the dummy memory cells, so that electrons are generated by a band to band tunneling effect in the dummy memory cell adjacent to the drain select transistor during the program operation.

According to the invention, the semiconductor device may improve an operation characteristic, thereby improving reliability thereof.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the invention will become more apparent to those of ordinary skill in the art by describing in detail embodiments thereof with reference to the attached drawings in which:

FIG. 1 is a diagram illustrating a semiconductor device according to an example embodiment of the invention;

FIGS. 2A to 2C are diagrams for describing a structure of a memory block according to an example embodiment of the invention;

DETAILED DESCRIPTION

Hereinafter, an embodiment of the invention will be described with reference to the accompanying drawings in detail. However, the invention is not limited to an embodiment disclosed below and may be implemented in various forms and the scope of the invention is not limited to the following embodiments. Rather, the embodiment is provided to more sincerely and fully disclose the invention and to completely transfer the spirit of the invention to those skilled in the art to which the invention pertains, and the scope of the invention should be understood by the claims of the invention.

FIG. 1 is a block diagram illustrating a semiconductor device according to an example embodiment of the invention.

Referring to FIG. 1, a semiconductor memory device may include a memory array 110 and operation circuits 120 to 140. The memory array 110 may include a plurality of memory blocks 110MB. Each memory block 110MB may include a plurality of memory strings, each of which includes a plurality of memory cells. For a flash memory device, the memory block includes flash memory cells. The flash memory cell may include a floating gate formed of polysilicon or a charge storage layer formed of a nitride film.

The memory strings of the memory block may be coupled to bit lines BL, respectively, and coupled to a common source line in parallel. The memory strings may be formed in a 2D structure or a 3D structure on a semiconductor substrate. A structure of the memory block will be described in more detail.

Figure 2B:
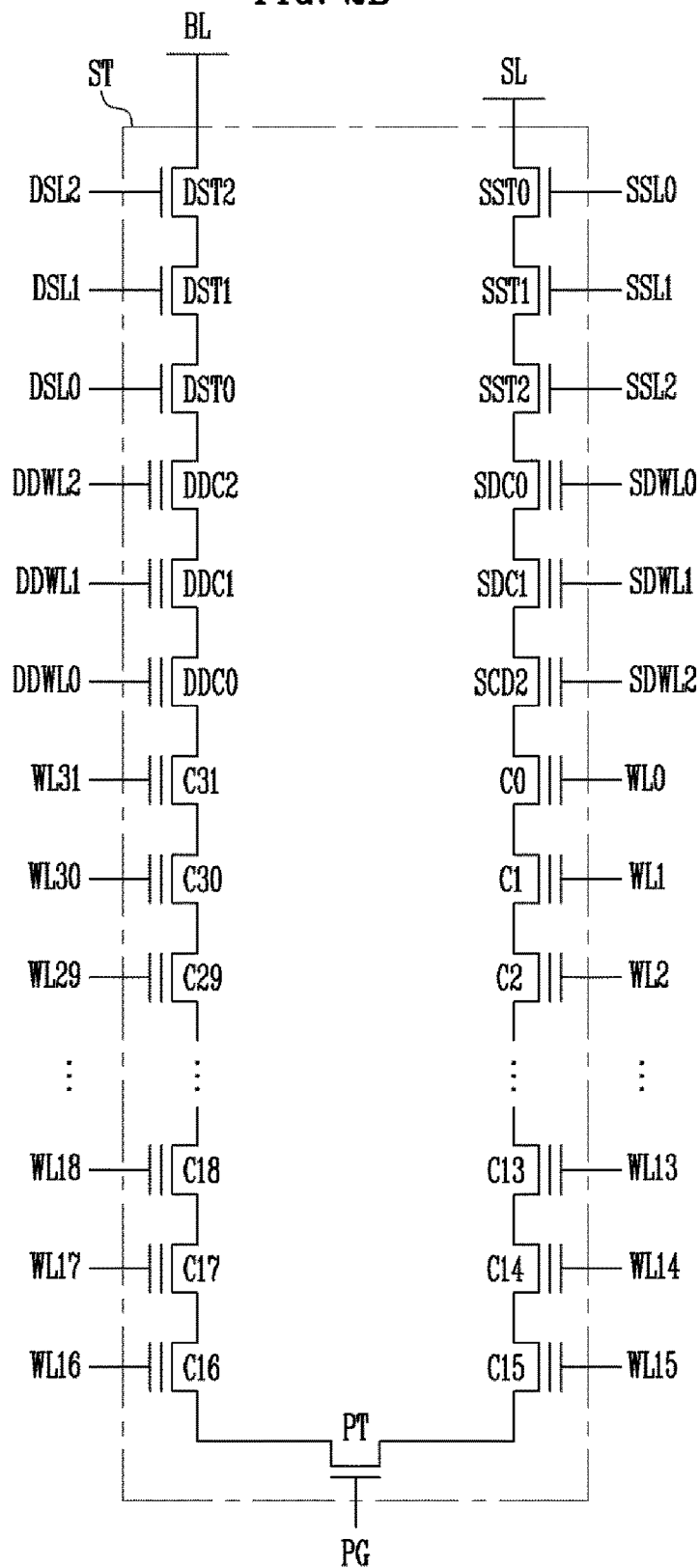
Figure 2C:
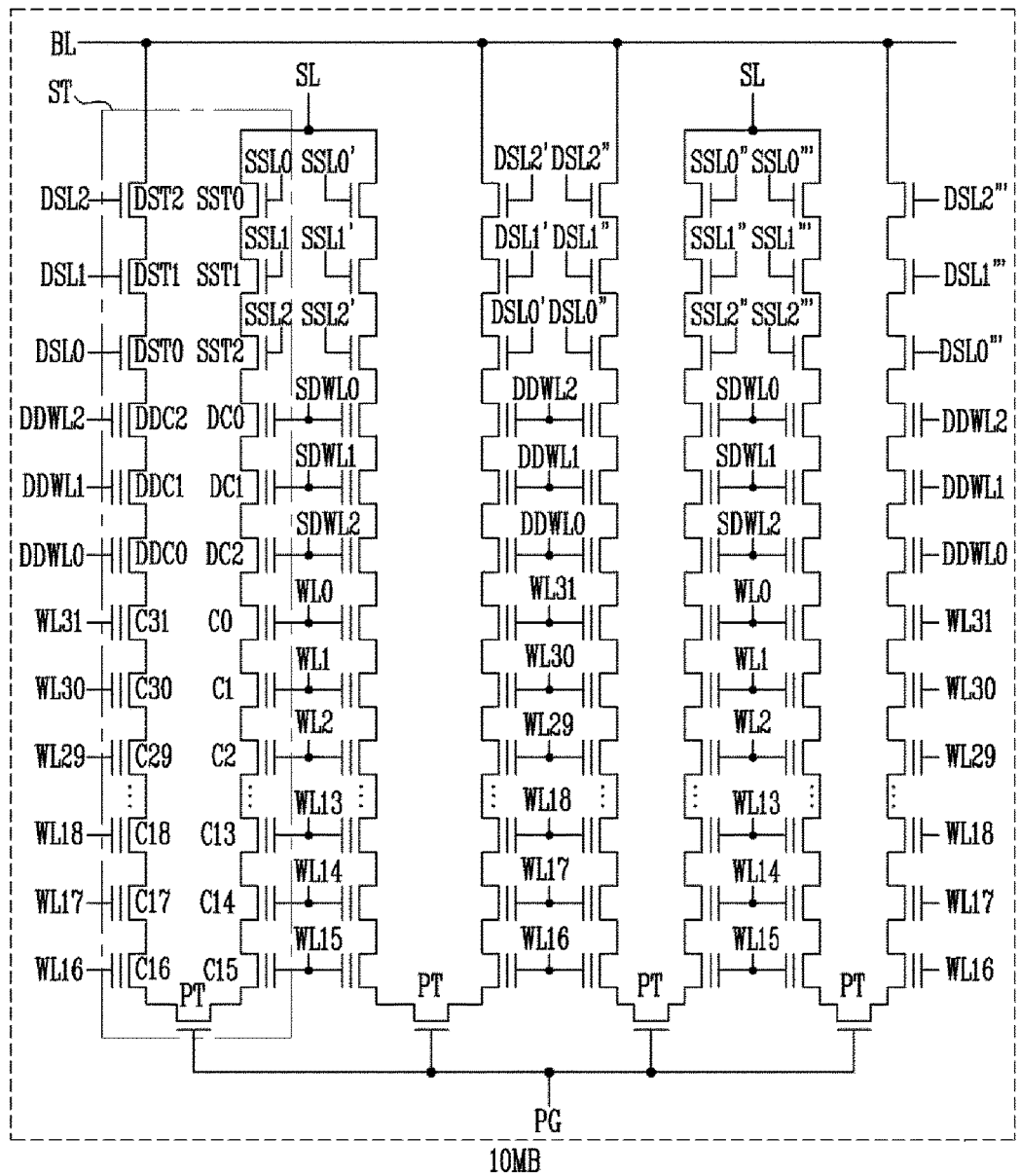

FIGS. 2A to 2C are diagrams for describing a structure of the memory block according to an example embodiment of the invention.

Referring to FIGS. 2A and 2B, the memory block may include a pipe gate PG, which is formed on a semiconductor substrate SUB and has a recess portion thereon, and a pipe channel layer PC, which is formed on the recess portion of the pipe gate PG. The memory block may also include a plurality of vertical channel layers formed on the pipe channel layer PC. For example, the plurality of vertical channel layers may include first and second vertical channel layers SP1 and SP2. An upper part of the first vertical channel layer SP1 may be coupled to a common source line SL, and an upper part of the second vertical channel layer SP2 may be coupled to a bit line BL. The vertical channel layers SP1 and SP2 may be formed of polysilicon.

The memory block may include a plurality of conductive layers DSL[2:0], DDWL[2:0], and WL[31:16] surrounding the second vertical channel layer SP2 at different heights, and a plurality of conductive layers SSL[0:2], SDWL[0:2], and WL[0:15] surrounding the first vertical channel layer SP1 at different heights. The memory block may include multiple layers (not shown), which include charge storage layers. The multiple layers are formed on surfaces of the vertical channel layers SP1 and SP2 and a surface of the pipe channel layer PC such that the multiple layers are positioned between the vertical channel layers SP1 and SP2 and the conductive layers DSL[2:0], DDWL[2:0], WL[31:16], SSL[0:2], SDWL[0:2], and WL[0:15], and between the pipe channel layer PC and the pipe gate PC.

The topmost conductive layers surrounding the second vertical channel layer SP2 may serve as drain select lines DSL[2:0], and lower conductive layers surrounding the second vertical channel layer SP2 may serve as dummy word lines DDWL[2:0] and main word lines WL[31:16]. The dummy word lines DDWL[2:0] are formed between the drain select lines DSL[2:0] and the main word lines WL[31:16]. The topmost conductive layers surrounding the first vertical channel layer SP1 may serve as source select lines SSL[0:2], and lower conductive layers surrounding the first vertical channel layer SP1 may serve as dummy word lines SDWL[0:2] and main word lines WL[1:15]. The dummy word lines SDWL[0:2] are formed between and main word lines WL[1:15].

The first vertical channel layer SP1 passing through the first conductive layers SSL[0:2], SDWL[0:2], and WL[0:15] is coupled between the source line SL and the pipe channel layer PC. The second vertical channel layer SP2 passing through the second conductive layers DSL[2:0], DDWL[2:0], and WL[31:16] is coupled between the bit line BL and the pipe channel layer PC.

Drain select transistors DST[2:0] shown in FIG. 2B are transistors formed where the drain select lines DLS[2:0] surround the second vertical channel layer SP2. Dummy memory cells DDC[2:0] are formed where the dummy word lines DDWL[2:0] surround the second vertical channel layer SP2, and main memory cells C[31:16] are formed where the word lines DDWL[2:0] and WL[31:16] surround the second vertical channel layer SP2. Source select transistors SST[0:2] are formed where the source select lines SSL[0:2] surround the first vertical channel layer SP1. Dummy memory cells SDC[0:2] are formed where the dummy word lines SDWL[0:2] surround the first vertical channel layer SP1, and main memory cells C[0:15] are formed where the word lines WL[0:15] surround the first vertical channel layer SP1.

As shown in FIG. 2B, a memory string ST may include the drain select transistors DST[2:0], the dummy memory cells DDC[2:0], and the main memory cells C[31:16], which are vertically formed over the substrate SUB and coupled between the bit line BL and the pipe channel layer PC, and the source select transistors SST[0:2], the dummy memory cells SDC[0:2], and the main memory cells C[0:15], which are vertically formed over the substrate SUB and coupled between the common source line SL and the pipe channel layer PC.

An embodiment of the invention provide that the plurality of select lines DSL[2:0] and SSL[0:2], the plurality of dummy word lines DDWL[2:0], SDWL[0:2], and the plurality of main word lines WL[0:31] are formed over the substrate SUB, but the number of dummy word lines and the number of main word lines are not limited thereto.

Referring to FIG. 2C, a memory block 10MB may include a plurality of memory strings ST coupled to the bit lines BL. Each memory string ST (e.g., a P-BiCS structure) includes the source select transistors SST[0:2], the dummy memory cells SCD[0:2], and the main memory cells C[0:15] vertically connected through the first vertical channel layer SP1 between the common source line SL and a pipe transistor PT formed on the substrate, and the drain select transistors DST[2:0], the dummy memory cells DDC[2:0], and the main memory cells C[31:16] vertically connected through the second vertical channel layer SP2 between the bit line BL and the pipe transistor PT of the substrate.

The source select transistors SST[0:2] are controlled by voltages applied to the source select lines SSL[0:2], and the drain select transistors DST[2:0] are controlled by voltages applied to the drain select lines DSL[2:0]. The dummy memory cells DDC[2:0] and SDC[0:2] are controlled by voltages applied to the stacked dummy word lines DDWL[2:0] and SDWL[0:2]. The main memory cells C[31:0] are controlled by voltages applied to the stacked main word lines WL[31:0].

When the memory block 10MB is selected, the pipe transistor PT connected between memory cells C15 and C16 positioned at a center of the memory string performs an operation of electrically connecting vertical channel layers SP1 and SP2 shown in FIG. 2A.

In a memory block having a 2D structure, each memory string is connected to a bit line, and the drain select transistors of the memory block are simultaneously controlled by one drain select line, whereas the memory block 10MB having the 3D structure may have the plurality of memory strings ST connected to a bit line BL in common. Here, the number of memory strings ST may vary.

Because each of the plurality of memory strings connected to a bit line BL in parallel must be individually selected, the drain select transistors DST[2:0], DST'[2:0], DST"[2:0], and DST'''[2:0] are independently controlled by select voltages applied to the drain select lines DSL[2:0], DSL'[2:0], DSL"[2:0], and DSL'''[2:0].

The dummy memory cells DDC[2:0] and SDC[0:2] and the main memory cells C[31:0] vertically connected in the memory block 110MB are controlled by the operating voltages applied to the stacked dummy word lines DDWL[2:0] and SDWL[0:2], and the stacked main word lines WL[31:0], respectively. The word lines WL[31:0] may be divided in a unit of a memory block.

Figure 3A:
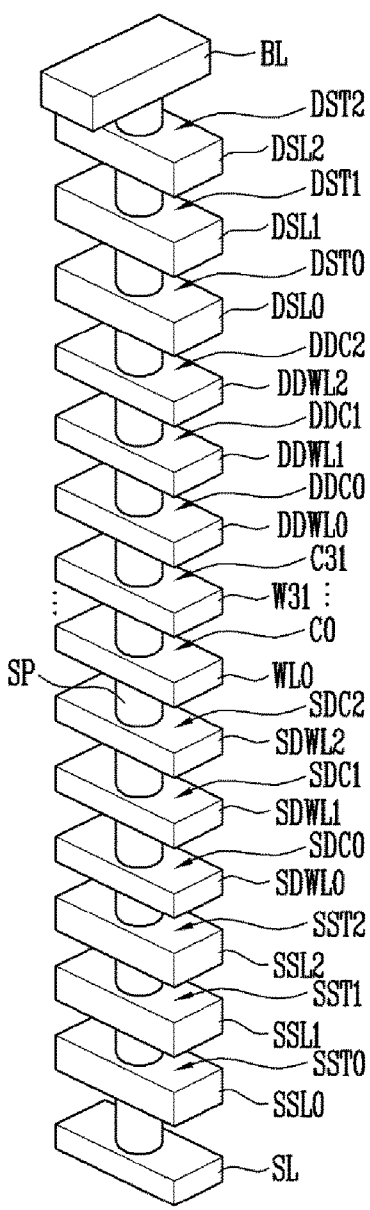
FIGS. 3A and 3B are diagrams for describing a memory block according to an example embodiment of the invention.
Figure 3B:
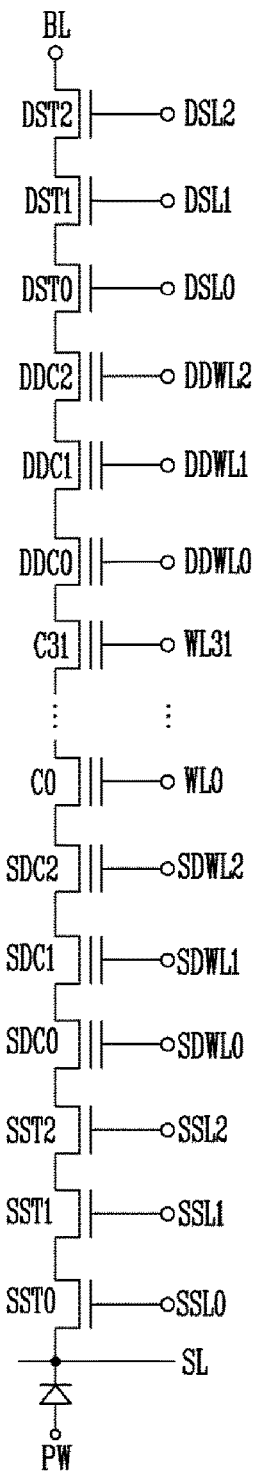

FIGS. 3A and 3B are diagrams for describing a memory block according to another example embodiment of the invention.

Referring to FIGS. 3A and 3B, a memory block may include a common source line SL formed on a semiconductor substrate 100 in which a P-well is formed. The memory block may also include a vertical channel layer SP formed on the common source line SL. An upper part of the vertical channel layer SP is coupled to a bit line BL. The vertical channel layer SP may be formed of polysilicon. The memory block may also include a plurality of conductive layers DSL[2:0], DDWL[2:0], WL[31:0], SDWL[2:0], and SSL[2:0] surrounding the vertical channel layer SP at different heights. The memory block may also include a multilayer (not shown), which includes a charge storage layer. The multilayer is formed on a surface of the vertical channel layer SP such that the multilayer is positioned between the vertical channel layer SP and conductive layers DSL[2:0], DDWL[2:0], WL[31:0], SDWL[2:0], and SSL[2:0].

The topmost conductive layers may serve as drain select lines DSL[2:0], and the bottommost conductive layers may serve as source select lines SSL[2:0]. Upper dummy lines DDWL[2:0], main word lines WL[31:0], and lower dummy word lines SDWL[2:0] are formed between the drain select lines DSL[2:0] and the source select lines SSL[2:0]. That is, the conductive layers DSL[2:0], DDWL[2:0], WL[31:0], SDWL[2:0], SSL[2:0] are formed on the semiconductor substrate in a form of a multilayer, and the vertical channel layer SP passing through the conductive layers DSL[2:0], DDWL[2:0], WL[31:0], SDWL[2:0], and SSL[2:0] are vertically connected between the bit line BL and the source line SL formed on the semiconductor substrate.

Drain select transistors DST[2:0] are formed between the topmost conductive layers DSL[2:0] and the vertical channel layer SP, upper dummy memory cells DDC[2:0] are formed where the upper dummy word lines DDWL[2:0] surround the vertical channel layer SP, the main memory cells C[31:0] are formed where the main word lines WL[31:0] surround the vertical channel layer SP, the lower dummy memory cells SCS[2:0] are formed where the lower dummy word lines SDWL[2:0] surround the vertical channel layer SP, and source select transistors SST[2:0] are formed where the bottommost conductive layers SSL[2:0] surround the vertical channel layer SP.

As shown in FIG. 3B, a memory string includes the source select transistors SST[2:0], the dummy memory cells SDC [2:0], the main memory cells C[31:0], the dummy memory cells DDS[2:0], and the drain select transistors DST[2:0], which are vertically formed over the substrate 110, and coupled between the common source line SL and the bit line BL.

The source select transistor SST[2:0] electrically connects the dummy memory cells DDC[2:0] and SDC[2:0] and the main memory cells C[31:0] to the common source line SL in response to source selection signals (not shown) applied to the source select lines SSL[2:0]. The drain select transistor DST[2:0] electrically connects the dummy memory cells DDC[2:0] and SDC[2:0] and the main memory cells C[31:0] to the bit line BL in response to drain selection signals (not shown) applied to the drain select lines SSL[2:0]. Referring back to FIGS. 1 and 2B, operation circuits 120 to 140 are configured to perform a program loop, an erase loop, and a read operation of the memory cells (e.g., the memory cell C0) connected to a selected word line (e.g., the word line WL0). The program loop includes a program operation and a verification operation, and the erase loop includes an erase operation and a verification operation. The operation circuits 120 to 140 may perform, after the erase loop, the program operation (e.g., a post program operation) for adjusting erase levels at which the threshold voltages of erased memory cells are distributed.

In order to perform the program loop, the erase loop, and the read operation, the operation circuits 120 to 140 may selectively output the operation voltages to the local lines DSL[2:0], DDWL[2:0], WL[31:0], SDWL[2:0], SSL[2:0], and PG of the selected memory block and the common source line SL, and control precharge/discharge of the bit lines BL, and sense a current flow or a voltage change of the bit lines BL.

A NAND flash memory device in accordance with an embodiment of the invention may include the operation circuits such as a control circuit 120, a voltage supply circuit 130, and a read/write circuit 140. Each constituent element will be described in detail below.

The control circuit 120 controls the voltage supply circuit 130 so as to generate operation voltages Vddwl[2:0], Vsdwl [2:0], Verase, Vpgm, Vread, Vverify, Vpass, Vdsl[2:0], Vssl[2:0], Vsl, and Vpg, which are to be used for performing the program loop, the erase loop, and the read operation. The control circuit 120 may output a voltage control signal CMDv and a row address signal RADD to the voltage supply circuit 130 in response to a command signal CMD, which is an external signal from outside the control circuit 120. The voltage supply circuit 130 may generate the operation voltages and apply the generated operation voltages to the local lines DSL[2:0], DDWL[2:0], WL[31:0], SDWL[2:0], SSL[2:0], and PG of the selected memory block and the common source line SL in response to the voltage control signal CMDv and the row address signal RADD. Further, the control circuit 120 may control the read/write circuit 140 so as to control precharge/discharge of the bit lines BL according to data to be stored in the memory cells when the program loop is performed. The read/write circuit 140 may also sense a current flow or a voltage change of the bit lines BL during the read operation or the verification operation. To this end, the control circuit 120 may output an operation control signal CMBpb to the read/write circuit 140.

The voltage supply circuit 130 generates operation voltages Vddwl[2:0], Vsdwl[2:0], Verase, Vpgm, Vread, Vverify, Vpass, Vdsl[2:0], Vssl[2:0], Vsl, and Vpg in response to the control signal CMDv of the control circuit 20 to use the operation voltages in the program loop, the erase loop, and the read operation of the memory cells. Here, the operation voltage may include dummy line voltages Vddwl [2:0] and Vsdwl[2:0], an erase voltage Verase, a program voltage Vpgm, a read voltage Vread, a pass voltage Vpass, select voltages Vdsl[2:0] and Vssl[2:0], a common source voltage Vsl, and a pipe gate voltage Vpg. Further, the voltage supply circuit 130 outputs the operation voltages to the local lines DSL[2:0], DDWL[2:0], WL[31:0], SDWL[2: 0], SSL[2:0], and PG of the selected memory block and the common source line SL in response to a row address signal RADD of the control circuit 120.

The read/write circuit 140 may include a plurality of page buffers (not shown) coupled to the memory array 110 through the bit lines BL. The page buffers may be connected to the bit lines BL, respectively. That is, one page buffer may be connected to one bit line. During the program operation, the page buffers selectively precharge the bit lines BL according to the control signal CMDpb of the control circuit 120 and data DATA to be stored in the memory cells. During the program verification operation or the read operation, the read/write circuit 140 may precharge the bit lines BL, and then sense a change in a voltage or currents of the bit lines BL, and latch data read from the memory cell according to the control signal CMDpb of the control circuit 120.

The operation circuits 120 to 140 may provide the operation voltages Vddwl[2:0] to the dummy memory cells DDC [2:0] so that electric charges (e.g., electrons) are generated by a tunneling effect between bands in the dummy memory cell DDC2 adjacent to the drain select transistor DST0 during the program operation.

Figure 4:
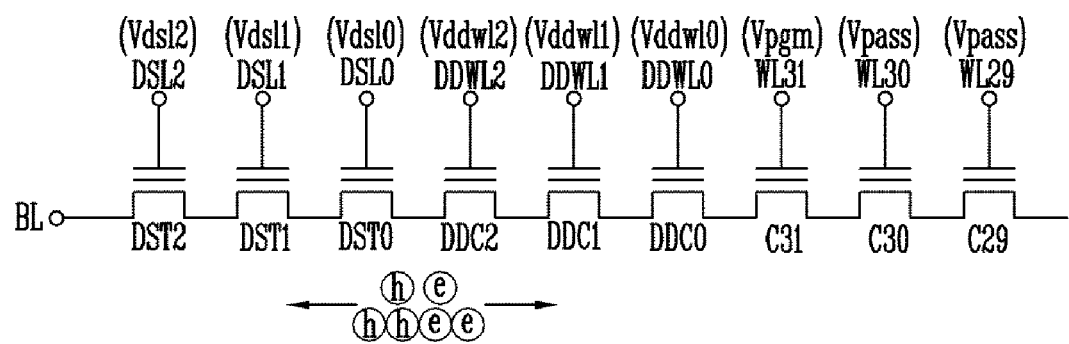
FIG. 4 is a diagram for describing an operating method of the semiconductor device according to an example embodiment of the invention.

FIG. 4 is a diagram for describing an operating method of the semiconductor device according to an example embodiment of the invention.

Referring to FIGS. 1 and 4, the program voltage Vpgm is applied to a selected word line WL31 and a pass voltage Vpass is applied to remaining word lines during the program operation. A plurality of memory cells C31 connected to the selected word line WL31 may be divided in a program permission cell and a program inhibition cell according to data to be stored. For example, the memory cell, in which erase data (e.g., logic 0) is stored, may become the program inhibition cell, and the memory cell, in which program data (e.g., logic 1) is stored, may become the program permission cell.

When the memory cell C31 is the program inhibition cell, a threshold voltage of the memory cell C31 should not be changed. That is, the electric charges (e.g., electron) should not be injected into the memory cell C31. When the dummy word lines DDWL0 to DDWL2 are formed between the drain select line DSL0 and the word line WL31, a band to band tunneling effect may occur in channel regions of the dummy memory cells DDC0 to DDC2 of the dummy word lines DDWL0 to DDWL2. Holes, which are positive changes, move toward the bit line BL, and the electrons moves toward the memory cell C31 by the band to band tunneling effect. In this case, since the program voltage Vpgm is also applied to the word line WL31 of the program inhibition cell 31, when the electrons move to the program inhibition cell C31, the electrons may be injected to a floating gate or a charge storage layer of the program inhibition cell C31 by the program voltage Vpgm. As a result, the threshold voltage of the program inhibition cell C31 may be changed. In an embodiment of the invention, unintended charge injection into program inhibition cells may decrease by changing a position where electrons are generated.

When performing the program operation of the selected memory block 110MB, the operation circuits 120 to 140 may provide operation voltages Vddwl0-Vddwl2 to the dummy memory cells DDC0 to DDC2, so that the electrons are generated by the band to band tunneling effect in the dummy memory cell DDC2 adjacent to the drain select transistor DST0. The operation circuits 120 to 140 may output the operation voltages Vddwl0-Vddwl2, so that the electrons are generated by the band to band tunneling effect in the drain select transistor DST0 and the dummy memory cell DDC2 during the program operation of the memory cell C31 adjacent to the dummy memory cell DDC0. Further, the operation circuits 120 to 140 may apply the operation voltages Vddwl0 to Vddwl2 to the dummy word lines DDWL0 to DDWL2, so that the electrons generated by the band to band tunneling effect flow into the dummy memory cell DDC0 adjacent to the memory cell C31.

To this end, the operation circuits 120 to 140 may apply the operation voltages Vddwl0 to Vddwl2 to the dummy memory cells DDC0 to DDC2 with the same level. Further, the operation circuits 120 to 140 may apply the operation voltages Vddwl0 to Vddwl2 to the dummy memory cells DDC0 to DDC2 with different levels. In this case, the operation circuits may apply, to the dummy memory cells DDC0 to DDC2, the operation voltages Vddwl0 to Vddwl2 having a higher level than that of the pass voltage Vpass applied to the non-selected memory cells C30 and C29. The operation circuits 120 to 140 may apply the operation voltages Vddwl0 to Vddwl2 of 10 V to 16V to the dummy memory cells DDC0 to DDC2.

The operation circuits 120 to 140 may apply, to the dummy memory cell DDC2 adjacent to the drain select transistor DST0, an operation voltage Vddwl2 higher than an operation voltage Vddwl0 being applied to the dummy memory cell DDC0 adjacent to the memory cell C31. For example, the operation circuits 120 to 140 may apply the operation voltage Vddwl0 of 12 V to the dummy word line DDWL0 of the dummy memory cell DDC0 adjacent to the memory cell C31, and apply the operation voltage Vddwl0 of 14 V to the dummy word line DDWL2 of the dummy memory cell DDC2 adjacent to the drain select transistor DST0. A voltage of 13 V, which is higher than the operation voltage Vddwl0 but lower than the operation voltage Vddwl0, may be applied to the dummy word line DDWL1 of the dummy memory cell DDC1 positioned in between the dummy memory cells DDC0 and DDC2.

The plurality of drain select transistors DST0 to DST2 may be connected in series between the bit line BL and the dummy memory cell DDC2. The operation circuits 120 to 140 may apply the same voltages Vdsl0 to Vdsl2 to the drain select lines DSL0 to DSL1 of the drain select transistors DST0 to DST2. For example, the operation circuits 120 to 140 may apply a power supply voltage to the drain select lines DSL0 to DSL1. Since the drain select lines DSL0 to DSL1 are divided, different voltages Vdsl0 to Vdsl2 may also be applied to the drain select lines DSL0 to DSL1. Further, the threshold voltages of the drain select transistors DST0 to DST2 may be differently set according to positions of the drain select transistors DST0 to DST2. When the threshold voltages of the drain select transistors DST0 to DST2 are differently set, the operation circuits 120 to 140 may selectively apply the voltages Vdsl0 to Vdsl2, which are larger than a ground voltage (e.g., 0 V) and smaller than the power supply voltage, to the drain select lines DSL0 to DSL1.

In addition, a plurality of source select transistors may be connected between the memory cell and the common source line, and the threshold voltages of the source select transistors or the voltages applied to the source select lines may be the same as each other.

As a result, if the electrons are generated by the band to band tunneling effect in the dummy memory cell DDC2 adjacent to the drain select transistor DST0 during the program operation, the electrons may flow into the dummy memory cell DDC0 and the threshold voltage of the program inhibition cell C31 may be prevented from being changed.

Figure 5:
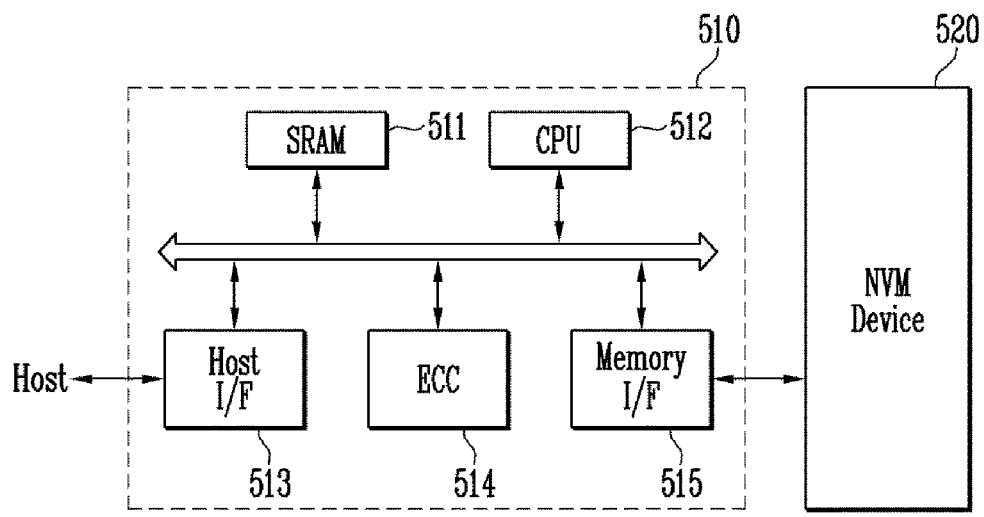
FIG. 5 is a block diagram schematically illustrating a memory system according to an example embodiment of the invention.

FIG. 5 is a block diagram schematically illustrating a memory system according to an example embodiment of the invention.

Referring to FIG. 5, a memory system 500 according to the example embodiment of the invention includes a nonvolatile memory device 520 and a memory controller 510.

The nonvolatile memory device 520 may correspond to the semiconductor device described with reference to FIGS. 1 to 4. The memory controller 510 may control the nonvolatile memory device 520. Examples of the memory system 500 may include a memory card, and Solid State Disk ("SSD"). An SRAM 511 is used as an operation memory of a processing unit 512. The host interface 513 includes a data exchange protocol of a host communicating with the memory system 500. An error correction block 514 detects and corrects an error included in the data read from a cell region of the nonvolatile memory device 520. A memory interface 514 provides interfaces for communicating with the nonvolatile memory device 520. The processing unit 512 performs a general control operation the memory controller 510.

In an embodiment, the memory system 500 may further include a ROM (not shown) storing code data for interfacing with the host. The nonvolatile memory device 520 may also be provided in a form of a multi-chip package including a plurality of flash memory chips. The memory system 500 may be provided as a highly reliable storage medium with an improved operation characteristic. Especially, the flash memory device of the invention may be included in a memory system such as the SSD. The memory controller 510 may communicate with an external device (e.g., the host) through one of various interface protocols such as USB, MMC, PCI-E, SATA, PATA, SCSI, ESDI, and IDE.

Figure 6:
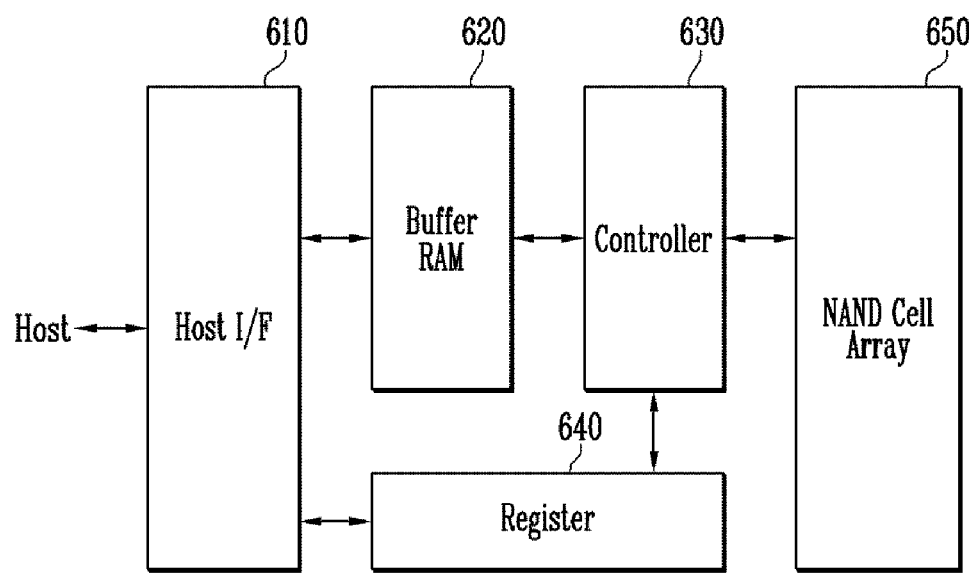
FIG. 6 is a block diagram schematically illustrating a fusion memory device or a fusion memory system performing program operations according to various embodiments.

FIG. 6 is a block diagram schematically illustrating a fusion memory device or a fusion memory system performing a program operation.

A fusion flash memory device 600 includes a host interface 610 for exchanging various information with a device using different protocols, a buffer RAM 620 including a code for driving the memory device or temporally storing data, a controller 630 for controlling a read operation, a program operation, and all states in response to a control signal and a command provided from the outside, a register 640 storing commands, addresses, and configuration information defining a system operating environment within the memory device, and a NAND flash cell array 650 formed of the operation circuit including a nonvolatile memory cell and a page buffer. The fusion flash memory device programs the data in response to a write request from the host.

Figure 7:
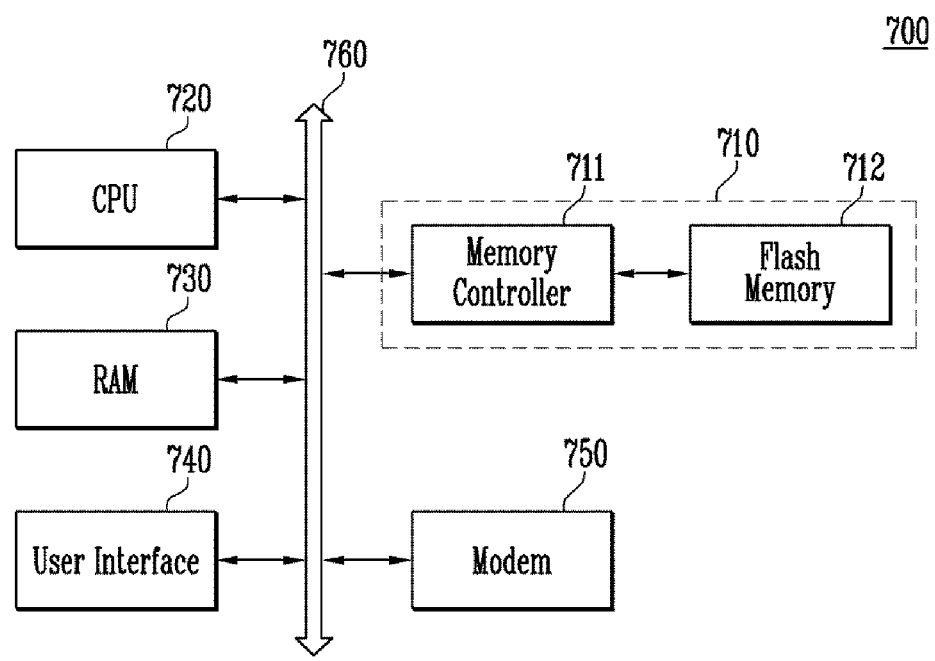
FIG. 7 is a block diagram schematically illustrating a computing system including a flash memory device according to an example embodiment of the invention.

FIG. 7 schematically illustrates a computing system including a flash memory device 712 according to an embodiment of the invention.

A computing system 700 may include a microprocessor 720 electrically connected to a system bus 760, a RAM 730, a user interface 740, a modem 750, such as a baseband chipset, and a memory system 710. In a case where the computing system 700 is a mobile device, a battery (not shown) for supplying an operating voltage of the computing system 700 may be further provided. Although it is not illustrated in the drawing, the computing system 700 may further include an application chipset, a Camera Image Processor ("CIS"), a mobile DRAM, and the like. The memory system 710 may further include, for example, an SSD using the nonvolatile memory described with reference to FIGS. 1 to 4 in order to store data. The memory system 710 may also be provided as a fusion flash memory.

As described above, the embodiment has been disclosed in the drawings and the specification. The specific terms used herein are for purposes of illustration, and do not limit the scope of the invention defined in the claims. Accordingly, those skilled in the art will appreciate that various modifications and another equivalent example may be made without departing from the scope and spirit of the disclosure. Therefore, the sole technical protection scope of the invention will be defined by the technical spirit of the accompanying claims.

What is claimed is:

1. A semiconductor device, comprising:
   a memory block including a plurality of memory strings, each of the memory strings including a drain select transistor coupled to a bit line, a source select transistor coupled to a common source line, dummy memory cells coupled to the drain select transistor, and memory cells coupled between the dummy memory cells and the source select transistor; and
   an operation circuit configured to perform a program operation on the memory cells,
   wherein the operation circuit generates operation voltages applied to the dummy memory cells so that electric charges are generated by a band to band tunneling effect in the dummy memory cell directly adjacent to the drain select transistor to reduce program disturbance of the normal memory cell during the program operation of at least one of the memory cells.

2. The semiconductor device of claim 1, wherein the operation circuit generates the operation voltages so that the electric charges flow into the dummy memory cell adjacent to the memory cell.

3. The semiconductor device of claim 1, wherein the operation circuit outputs the operation voltages so that the electric charges are generated by the band to band tunneling effect in the dummy memory cell adjacent to the drain select transistor during a program operation of a memory cell adjacent to the dummy memory cell.

4. The semiconductor device of claim 1, wherein the operation circuit is configured to apply, to the dummy memory cells, the operation voltages with the same level.

5. The semiconductor device of claim 1, wherein the operation circuit is configured to apply, to the dummy memory cells, operation voltages having a higher level than that of a pass voltage applied to non-selected memory cells.

6. The semiconductor device of claim 1, wherein the operation circuit is configured to apply, to the dummy memory cells, the operation voltages with different levels.

7. The semiconductor device of claim 6, wherein the operation circuit is configured to apply, to the dummy cell adjacent to the drain select transistor, an operation voltage higher than an operation voltage being applied to the dummy memory cell adjacent to the memory cell.

8. The semiconductor device of claim 6, wherein the operation circuit is configured to apply, to the dummy memory cells adjacent to the drain select transistor, a higher operation voltage than a pass voltage applied to non-selected memory cells.

9. The semiconductor device of claim 1, wherein the drain select transistor comprises a plurality of drain select transistors coupled in series between the bit line and the dummy memory cell.

10. The semiconductor device of claim 9, wherein the operation circuit is configured to apply the same voltage to the drain select transistors.

11. A semiconductor device, comprising:
   a memory block including memory strings coupled between a bit line and a common source line, each of the memory strings including a drain select transistor, dummy memory cells, and memory cells, which are vertically formed on a substrate and are coupled in series to the bit line; and
   an operation circuit configured to perform a program operation of the memory cells,
   wherein the operation circuit generates operation voltages applied to the dummy memory cells so that electric charges are generated by a band to band tunneling effect in the dummy memory cell directly adjacent to the drain select transistor to reduce program disturbance of the normal memory cell during the program operation of at least one of the memory cells.

12. The semiconductor device of claim 11, wherein the operation circuit generates the operation voltages so that the electric charges flow into the dummy memory cell adjacent to the memory cell.

13. The semiconductor device of claim 11, wherein the operation circuit outputs the operation voltages so that the electric charges are generated by the band to band tunneling effect in the dummy memory cell adjacent to the drain select transistor during a program operation of a memory cell adjacent to the dummy memory cell.

14. The semiconductor device of claim 11, wherein the operation circuit is configured to apply, to the dummy memory cells, the operation voltages with the same level.

15. The semiconductor device of claim 11, wherein the operation circuit is configured to apply, to the dummy memory cells, operation voltages with the same level to that of a pass voltage applied to non-selected memory cells.

16. The semiconductor device of claim 11, wherein the operation circuit is configured to apply, to the dummy memory cells, the operation voltages with different levels.

17. The semiconductor device of claim 16, wherein the operation circuit is configured to apply, to the dummy cell adjacent to the drain select transistor, an operation voltage higher than an operation voltage being applied to the dummy memory cell adjacent to the memory cell.

18. The semiconductor device of claim 16, wherein the operation circuit is configured to apply, to the dummy memory cells adjacent to the drain select transistor, a higher operation voltage than a pass voltage applied to non-selected memory cells.

19. The semiconductor device of claim 11, wherein the drain select transistor comprises a plurality of drain select transistors coupled in series between the bit line and the dummy memory cell.

20. The semiconductor device of claim 19, wherein the operation circuit is configured to apply the same voltage to the drain select transistors.

* * * * *